United States Patent [19]

Yamauchi et al.

[11] Patent Number: 5,416,444
[45] Date of Patent: May 16, 1995

[54] RING OSCILLATOR AND PULSE PHASE DIFFERENCE ENCODING CIRCUIT

[75] Inventors: Shigenori Yamauchi, Kariya; Takamoto Watanabe, Nagoya; Yoshinori Ohtsuka, Okazaki, all of Japan

[73] Assignee: Nippondenso Co., Ltd., Aichi-Pref., Japan

[21] Appl. No.: 177,682

[22] Filed: Jan. 5, 1994

[30] Foreign Application Priority Data

Jan. 14, 1993 [JP] Japan .................... 5-005209

[51] Int. Cl.⁶ .................... H03B 5/00; G01R 25/08
[52] U.S. Cl. .................... 331/45; 324/76.82; 331/57; 331/60; 331/173; 331/DIG. 3; 327/3
[58] Field of Search .................... 331/45, 57, 60, 173, 331/DIG. 3; 307/514, 516; 328/133, 134; 324/76.82

[56] References Cited

U.S. PATENT DOCUMENTS

| | | | |
|---|---|---|---|
| 3,350,659 | 10/1967 | Henn | 331/57 |
| 4,978,927 | 12/1990 | Hausman et al. | 331/57 |
| 5,128,624 | 7/1992 | Hoshino et al. | 328/133 |
| 5,134,371 | 7/1992 | Watanabe et al. | 324/252 |

FOREIGN PATENT DOCUMENTS 3125514  5/1991  Japan .
3220814  9/1991  Japan .

Primary Examiner—Siegfried H. Grimm
Attorney, Agent, or Firm—Cushman, Darby & Cushman

[57] ABSTRACT

A ring oscillator for circulating pulse edges of two types therein includes an even number of inverting circuits connected in a ring. Each of the inverting circuits is operative to invert an input signal and output an inversion of the input signal. One of the inverting circuits is a first start inverting circuit which starts an operation of inverting an input signal in response to a first control signal applied from an external input. One of the inverting circuits except the first start inverting circuit and an inverting circuit immediately following the first start inverting circuit is a second start inverting circuit which starts an operation of inverting an input signal in response to a second control signal. A control signal inputting arrangement serves to input the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit.

10 Claims, 8 Drawing Sheets

RING OSCILLATOR AND PULSE PHASE DIFFERENCE ENCODING CIRCUIT

BACKGROUND OF THE INVENTION

1. Field of the Invention

This invention relates to a ring oscillator having a plurality of inverting circuits connected in a ring through which a pulse edge is circulated. This invention also relates to a pulse phase difference encoding circuit which uses such a ring oscillator in encoding the phase difference between two pulse signals into a digital signal.

2. Description of the Prior Art

U.S. Pat. No. 5,128,624 corresponding to Japanese published unexamined patent application 3-220814 discloses a pulse phase difference encoding circuit which detects the phase difference between two pulse signals and then encodes the detected phase difference into a digital signal.

The pulse phase difference encoding circuit in U.S. Pat. No. 5,128,624 uses a ring oscillator having a given odd number of inverting circuits connected in a ring through which a pulse edge is circulated. When a first pulse signal PA is inputted into the pulse phase difference encoding circuit, the pulse edge stats to be circulated in the ring oscillator. The pulse phase difference encoding circuit includes first and second detecting sections responsive to a second pulse signal PB which is inputted into the pulse phase difference encoding circuit after the first pulse signal PA is inputted. The first section detects the number of rounds of the pulse edge, that is, the number of times of complete circulation of the pulse edge, in the ring oscillator during a period equal to the phase difference between the two pulse signals PA and PB. The second section detects an inverting circuit in the ring oscillator which the pulse edge reaches at the moment of the inputting of the pulse signal PB. In other words, the second section detects the position of the pulse edge in the ring oscillator at the moment of the inputting of the pulse signal PB. The first and second sections convert the detected parameters into corresponding digital signals which are combined into a composite digital signal representative of the phase difference between the pulse signals PA and PB.

SUMMARY OF THE INVENTION

It is an object of this invention to provide an improved ring oscillator.

It is another object of this invention to provide an improved pulse phase difference encoding circuit using a ring oscillator.

A first aspect of this invention provides a ring oscillator for circulating pulse edges of two types therein which comprises an even number of inverting circuits connected in a ring, wherein each of the inverting circuits is operative to invert an input signal and output an inversion of the input signal; wherein one of the inverting circuits comprises a first start inverting circuit which starts an operation of inverting an input signal in response to a first control signal applied from an external input; wherein one of the inverting circuits except the first start inverting circuit and an inverting circuit immediately following the first start inverting circuit comprises a second start inverting circuit which starts an operation of inverting an input signal in response to a second control signal; and control signal inputting means for inputting the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit.

A second aspect of this invention provides a pulse phase difference encoding circuit comprising a ring oscillator for circulating pulse edges of two types therein which comprises an even number of inverting circuits connected in a ring, wherein each of the inverting circuits is operative to invert an input signal and output an inversion of the input signal; wherein one of the inverting circuits comprises a first start inverting circuit which starts an operation of inverting an input signal in response to a first control signal applied from an external input; wherein one of the inverting circuits except the first start inverting circuit and an inverting circuit following the first start inverting circuit comprises a second start inverting circuit which starts an operation of inverting an input signal in response to a second control signal; and control signal inputting means for inputting the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit; means for inputting a first input signal into the first start inverting circuit from an external input as the first control signal; output terminals for outputting output signals of the inverting circuits in the ring oscillator respectively; counting means receiving an output signal from a given output terminal of said output terminals for counting a number of times a pulse edge initially generated by the start of the inverting operation of the first start inverting circuit circulates in the ring oscillator during an interval from a moment of the start of the inverting operation of the first start inverting circuit in response to the first input signal to a moment at which a second input signal is inputted, and for outputting a digital signal representing said count number; pulse edge detecting means receiving the output signals from the output terminals for detecting which of the inverting circuits the pulse edge initially generated by the start of the inverting operation of the first start inverting circuit reaches when the second input signal is inputted; and an encoder for outputting a number of inverting circuits from the first start inverting circuit to the inverting circuit detected by the pulse edge detecting means as a digital signal; wherein a final digital signal is outputted as an indication of a phase difference between the first input signal and the second input signal, and the final digital signal has higher bits composed of the digital signal from the counting means and lower bits composed of the digital signal from the encoder.

A third aspect of this invention provides a ring oscillator comprising an even number of inverting circuits connected in a first ring, wherein each of the inverting circuits is operative to invert an input signal and output an inversion of the input signal; wherein one of the inverting circuits comprises a first start inverting circuit which starts an operation of inverting an input signal in response to a first control signal applied from an external input; wherein one of the inverting circuits except the first start inverting circuit comprises a second start inverting circuit which starts an operation of inverting an input signal in response to a second control signal; and an odd number of inverting circuits including the second start inverting circuit and being connected in a second ring, wherein an output signal of one of the inverting circuits in the second ring is used as the second control signal.

A fifth aspect of this invention provides a ring oscillator comprising an even number of inverting circuits connected in a ring, wherein each of the inverting circuits is operative to invert an input signal and output an inversion of the input signal; wherein first one of the inverting circuits comprises a first start inverting circuit which starts an operation of inverting an input signal in response to a first control signal applied from an external input; wherein second one of the inverting circuits comprises a second start inverting circuit which starts an operation of inverting an input signal in response to an output signal of a third one of the inverting circuits which precedes the second start inverting circuit by an even number of inverting circuits.

A sixth aspect of this invention provides an oscillator comprising a predetermined even number of inverting circuits connected in a loop and each being able to output an output signal having a predetermined inversion relation with an input signal thereto; means for selectively breaking and enabling the predetermined inversion relation between the input signal and the output signal to and from a first one of the inverting circuits in response to an externally applied signal; and means for selectively breaking and enabling the predetermined inversion relation between the input signal and the output signal to and from a second one of the inverting circuits in response to the output signal of one of the inverting circuits except the second one in the loop.

DESCRIPTION OF THE PREFERRED EMBODIMENTS

First Basic Embodiment

Figure 1:
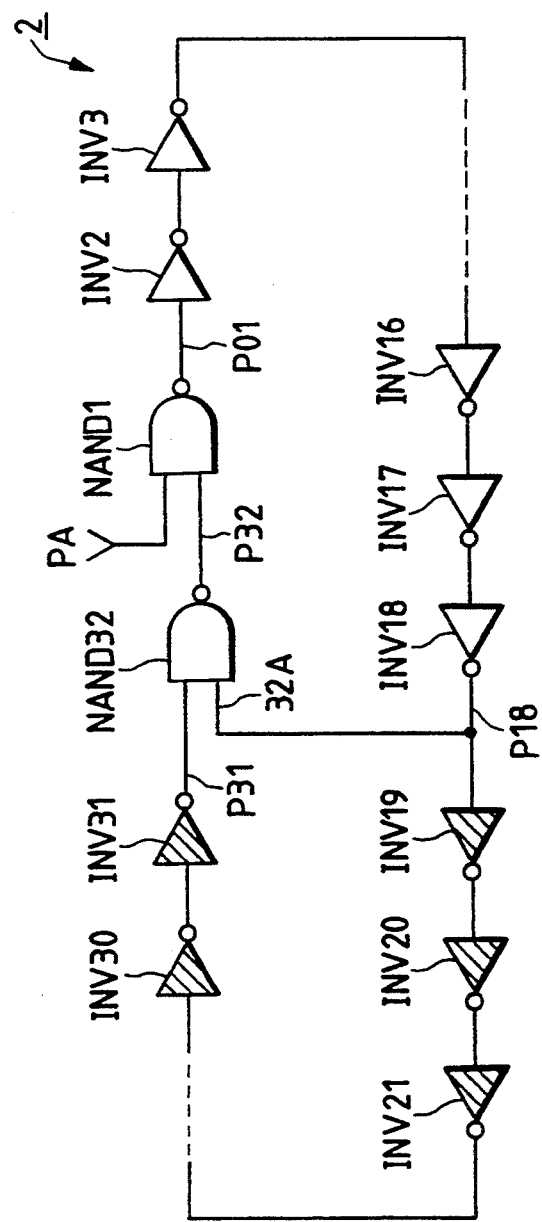
FIG. 1 is a diagram of a ring oscillator according to a first specific embodiment of this invention.

According to a first basic embodiment of this invention, a ring oscillator for circulating pulse edges of two types therein includes an even number of inverting circuits connected in a ring. Each of the inverting circuits is operative to invert an input signal and output an inversion of the input signal. One of the inverting circuits is a first start inverting circuit which starts an operation of inverting an input signal in response to a first control signal applied from an external input. One of the inverting circuits except the first start inverting circuit and an inverting circuit immediately following the first start inverting circuit is a second start inverting circuit which starts an operation of inverting an input signal in response to a second control signal. A control signal inputting arrangement serves to input the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit.

Under initial conditions where the inverting operation of the first and second start inverting circuits are forced to be suspended by the first and second control signals, the first and second start inverting circuits output signals having levels equal to the levels of the output signals of the immediately-preceding inverting circuits respectively. Accordingly, under the initial conditions, an input signal into and an output signal from each of the inverting circuits except the first and second start inverting circuits are different in level from each other so that the ring oscillator falls into a stable state (non-oscillating state). It should be noted that the total number of the inverting circuits except the first and second start inverting circuits is even.

When the first control signal is inputted into the first start inverting circuit from the external input, the first start inverting circuit starts the operation of inverting an input signal and simultaneously the initial conditions are terminated. During a subsequent period, if the input signal changes from a low level to a high level, the output signal of the first start inverting circuit changes from a high level to a low level. In addition, the output signal of the next inverting circuit changes from a low level to a high level, and the output signal of the second next inverting circuit changes from a high level to a low level. The output signals of the inverting circuits are sequentially changed in such a way, so that a pulse edge travels and circulates in the ring oscillator while sequentially passing through the inverting circuits.

The control signal inputting arrangement applies the second control signal to the second start inverting circuit to start the inverting operation of the second start inverting circuit during the interval from the first moment at which the first control signal is inputted into the first start inverting circuit and the first start inverting circuit starts the inverting operation to the second moment at which a pulse edge (referred to as a main pulse edge) initially generated by the start of the inverting operation of the first start inverting circuit and travelling while being sequentially inverted by the inverting circuits enters the second start inverting circuit.

At the moment of the start of the inverting operation of the second start inverting circuit, the main pulse edge has not yet reached the second start inverting circuit so that an input signal and an output signal into and from the second start inverting circuit remain at original levels.

When the second start inverting circuit starts to operate, a reset pulse edge is generated. Then, the reset pulse edge and also the main pulse edge circulate in the ring oscillator.

In a simple ring combination of an even number of inverting circuits, it is generally difficult for a pulse edge to circulate therein since stable conditions (non-oscillating conditions) tend to occur where signals inputted into and outputted from each inverting circuit have different levels respectively. On the other hand, the ring oscillator of this embodiment is prevented from falling into stable conditions (non-oscillating conditions). Specifically, in the ring oscillator, the main pulse edge and the reset pulse edge circulate while being positionally spaced. The output signal of the first start inverting circuit is changed by the reset pulse edge before the main pulse edge generated by the first start inverting circuit returns to the first start inverting circuit. In addition, the output signal of the second start inverting circuit is changed by the main pulse edge before the reset pulse edge generated by the second start inverting circuit returns to the second start inverting circuit. These processes prevent the ring oscillator from falling into stable conditions (non-oscillating conditions). Therefore, the main pulse edge and the reset pulse edge continue to circulate.

Although the ring oscillator has the ring combination of the even number of the inverting circuits, the ring oscillator is therefore prevented from falling into stable conditions (non-oscillating conditions) and the main pulse edge and the reset pulse edge continue to circulate therein. Thus, the output signal of a given inverting circuit among the inverting circuits can be used as an accurate clock signal having a period equal to the even number times the operation delay time of each inverting circuit.

Second Basic Embodiment

A ring oscillator of a second basic embodiment of this invention is similar to the ring oscillator of the first basic embodiment except for the following points.

In the ring oscillator of the second basic embodiment, the control signal inputting arrangement has a section for inputting an output signal of a given inverting circuit, which precedes the second start inverting circuit as viewed from a side of the first start inverting circuit by stages corresponding to an even number of inverting circuits equal to or smaller than a half of the total number of all the inverting circuits, into the second start inverting circuit as the second control signal.

In addition, the second start inverting circuit has a first section for, in cases where a signal level of the second control signal and a signal level of an input signal from an inverting circuit immediately-preceding the second start inverting circuit are equal, inverting the signal level and outputting an inversion of the signal level, and a second section for, in cases where the signal level of the second control signal and the signal level of the input signal from the inverting circuit immediately-preceding the second start inverting circuit are different, inverting one of the two signal levels and outputting an inversion of one of the two signal levels with priority which is equal to a signal level of the second control signal inputted from the given inverting circuit when the first start inverting circuit does not start the inverting operation.

Under the initial conditions where the inverting operation of the first start inverting circuit is forced to be suspended by the first control signal, the first start inverting circuit outputs a signal having a level equal to the level of the output signal of the immediately-preceding inverting circuit. Under the initial conditions, the input signal to the second start inverting circuit from the immediately-preceding inverting circuit is different in level from the second control signal or the input signal to the second start inverting circuit from the given inverting circuit. The level difference results from the fact that the given inverting circuit precedes the second start inverting circuit as viewed from the side of the first start inverting circuit by stages corresponding to the even number of inverting circuits equal to or smaller than a half of the total number of all the inverting circuits, and thus an odd number of inverting circuits are connected between the given inverting circuit and the second start inverting circuit.

Under the initial conditions, the second start inverting circuit inverts the signal level (referred to as a prior signal level) of the second control signal applied from the given inverting circuit, and outputs an inversion of the signal level. Therefore, the second start inverting circuit outputs a signal having a level equal to the signal level (referred to as an unprior level) of the input signal from the immediately-preceding inverting circuit, and the ring oscillator is in a stable state or a non-oscillating state.

When the first control signal is inputted into the first start inverting circuit from the external input, the first start inverting circuit starts the operation of inverting an input signal and simultaneously the initial conditions are terminated. At this time, a main pulse edge is generated. During a subsequent period, the main pulse edge travels and circulates in the ring oscillator as in the first basic embodiment.

When the main pulse edge reaches the given inverting circuit, the level of the second control signal changes to the subsequent level equal to the level of the output signal of the inverting circuit which immediately precedes the second start inverting circuit. Accordingly, the second start inverting circuit starts the inverting operation and the output signal thereof changes in level, so that a reset pulse edge is generated as in the first basic embodiment. Then, the reset pulse edge and also the main pulse edge circulate in the ring oscillator.

The main pulse edge travels from the given inverting circuit to the second start inverting circuit. During this travel, the main pulse edge passes through an odd number of inverting circuits along a normal route between the given inverting circuit and the second start inverting circuit while being sequentially inverted thereby. Since the second control signal is in the unprior level when the main pulse edge reaches the second start inverting circuit, the main pulse edge passes through the second start inverting circuit and the later inverting circuits while being sequentially inverted thereby. In this way, the main pulse edge continues to travel and circulate in the ring oscillator.

As previously described, the second control signal remains at the subsequent level when the main pulse edge reaches the second start inverting circuit via the normal route. This fact results for the following reason. The odd number of the inverting circuits between the given inverting circuit and the second start inverting circuit is equal to or smaller than half of the number of all the inverting circuits composing the ring oscillator.

Therefore, the main pulse edge travels to the second start inverting circuit from the given inverting circuit via the normal route before the related reset pulse edge starting from the second start inverting circuit reaches the given inverting circuit.

The input signal to the second start inverting circuit from the immediately-preceding inverting circuit is changed from the subsequent level to the prior level by the main pulse edge.

The reset pulse edge generated by the second start inverting circuit reaches the given inverting circuit via inverting circuits including the first start inverting circuit which are different from the odd number of the inverting circuits between the given inverting circuit and the second start inverting circuit. The reset pulse edge which reaches the given inverting circuit changes the second control signal from the subsequent level to the prior level. At this time, since the input signal to the second start inverting circuit from the immediately-preceding inverting circuit has already been changed to the prior level by the main pulse edge, the output signal of the second start inverting circuit does not change in response to the change in the second control signal. Also, the reset pulse edge travels from the given inverting circuit to the second start inverting circuit via the normal route.

When the reset pulse edge reaches the inverting circuit immediately preceding the second start inverting circuit via the normal route, the input signal to the second start inverting circuit from the immediately-preceding inverting circuit changes from the prior level to the subsequent level. At the same time, the main pulse edge reaches the given inverting circuit so that the second control signal also changes from the prior level to the subsequent level.

The reset pulse edge and the main pulse edge simultaneously enter the second start inverting circuit for the following reason. As previously described, the main pulse edge starts from the first start inverting circuit and circulates once in the ring oscillator via the normal route, and then reaches the given inverting circuit from the first start inverting circuit. On the other hand, the reset pulse edge is generated by the second start inverting circuit in response to the main pulse edge (referred to as the original pulse edge) which reaches the given inverting circuit for the first time after the start from the first start inverting circuit. Then, the reset pulse edge circulates once in the ring oscillator via the normal route before reaching the second start inverting circuit. During these processes, the total number of inverting circuits passed by the main pulse edge is equal to the total number of inverting circuits passed by the original pulse edge and the reset pulse edge.

When both the input signal to the second start inverting circuit from the immediately-preceding inverting circuit and the second control signal assume the subsequent levels, the output Signal of the second start inverting circuit changes in level. This process is similar to the previously-mentioned process in which the output signal of the second start inverting circuit is changed in level by the second control signal.

Thus, a reset pulse edge is regenerated in response to the main pulse edge, and the regenerated reset pulse edge travels from the second start inverting circuit toward the first start inverting circuit. On the other hand, the main pulse edge travels from the given inverting circuit toward the second start inverting circuit along the normal route. In this way, the main pulse edge and the reset pulse edge travel and circulate in the ring oscillator.

During a later period, the previously-mentioned processes are reiterated. Thus, a reset pulse edge is periodically generated at a period corresponding to one complete revolution or circulation of the main pulse edge in the ring oscillator via the normal route.

Since the second control signal is inputted to the second start inverting circuit during the interval from the start of the inverting operation of the first start inverting circuit to the moment of the entrance of the main pulse edge into the second start inverting circuit, the oscillation of the ring oscillator can be reliably started by inputting the first control signal to the first start inverting circuit without providing an additional circuit.

Third Basic Embodiment

A ring oscillator of a third basic embodiment of this invention is similar to the ring oscillator of the first basic embodiment except for the following points.

A response time is now defined as being equal to an interval from a moment of an inversion of an input signal into each inverting circuit to a moment of an inversion of an output signal from the inverting circuit. In the ring oscillator of the third basic embodiment, a response time with respect to the first pulse edge (the main pulse edge) is longer than a response time with respect to the second pulse edge (the reset pulse edge) inverted to a level opposite a level of the first pulse edge. Therefore, the reset pulse edge enters the second start inverting circuit from the immediately-preceding inverting circuit before the main pulse edge enters the second start inverting circuit from the given inverting circuit as the second control signal. Thus, a reset pulse edge disappears before a next reset pulse edge is generated in response to the main pulse edge.

In an assumed case where the main pulse edge reaches the second start inverting circuit immediately before the reset pulse edge reaches the second start inverting circuit, the output signal of the second start inverting circuit changes in response to the reset pulse edge so that the reset pulse edge does not disappear and passes through the second start inverting circuit. In the assumed case, there is a chance that the main pulse edge catches up with the reset pulse edge and finally stable conditions (non-oscillating conditions) occur. Thus, the reiterative generation and disappearance of the reset pulse edge prevent the ring oscillator from falling into stable conditions (non-oscillating conditions), and a variation among response times of the inverting circuits is compensated.

Fourth Basic Embodiment

According to a fourth basic embodiment of this invention, a pulse phase difference encoding circuit includes the ring oscillator of the first basic embodiment. The pulse phase difference encoding circuit also includes an input device for inputting a first input signal into the first start inverting circuit from an external input as the first control signal, and output terminals for outputting output signals of the inverting circuits in the ring oscillator respectively.

In the pulse phase difference encoding circuit, a counting device receiving an output signal from a given output terminal of the output terminals serves to count a number of times (rounds) a pulse edge initially generated by the start of the inverting operation of the first start inverting circuit circulates in the ring oscillator during an interval from a moment of the start of the inverting operation of the first start inverting circuit in response to the first input signal to a moment at which a second input signal is inputted. The counting device outputs a digital signal representing the count number.

In addition, a pulse edge detecting device receiving the output signals from the output terminals serves to detect which of the inverting circuits the pulse edge initially generated by the start of the inverting operation of the first start inverting circuit reaches when the second input signal is inputted. Furthermore, an encoder outputs a number of inverting circuits from the first start inverting circuit to the inverting circuit detected by the pulse edge detecting device as a digital signal.

A final digital signal is outputted as an indication of a phase difference between the first input signal and the second input signal, and the final digital signal has higher bits composed of the digital signal from the counting device and lower bits composed of the digital signal from the encoder.

It is now assumed that 32 inverting circuits compose the ring oscillator. It is also assumed that the main pulse edge circulates three times in the ring oscillator during the interval from the application of the first input signal to the application of the second input signal, and that the main pulse edge reaches the 26-th inverting circuit counted from the first start inverting circuit at the end of the interval. In this case, the digital output signal of the counting device is "11" while the digital output signal of the encoder is "11001". Thus, the final digital signal representing the phase difference between the first input signal and the second input signal is "1111001" resulting from the combination of the output signals of the counting device and the encoder as the higher bits and the lower bits respectively.

In the pulse phase difference encoding circuit of this embodiment, the digital output signal of the counting device is directly used as the higher bits of the final digital signal representing the phase difference between the first input signal and the second input signal. Thus, it is unnecessary to provide an operation device such as a subtracter for processing the digital output signal of the counting device to generate a part of a final phase difference signal. Since the pulse phase difference encoding circuit has a simple design, it can be made into a small size. In the pulse phase difference encoding circuit, the outputting of the detected phase difference can be completed in a short time, and a high detection speed can be attained. Furthermore, the pulse phase difference encoding circuit has a high resolution in the phase difference detection.

First Specific Embodiment

With reference to FIG. 1, a ring oscillator 2 having a given even number of stages includes 32 inverting circuits connected in a ring or loop. The inverting circuits are a 2-input NAND gate NAND1, 30 inverters INV2, INV3, . . . , and INV31, and a 2-input NAND gate NAND32 which are sequentially connected in that order. The NAND gate NAND1 forms a first inverting circuit for start and control. The NAND gate NAND32 also forms a second inverting circuit for start and control.

A first input terminal of the NAND gate NAND1 receives a start pulse signal PA from an external circuit (not shown). The start pulse signal PA is a first control signal. A second input terminal of the NAND gate NAND1 is connected to the output terminal of the NAND gate NAND32. The NAND gate NAND1 is successively followed by the inverters INV2, INV3, . . . , and INV31. A first input terminal of the NAND gate NAND32 is connected to the output terminal of the inverter INV31. A second input terminal of the NAND gate NAND32 is connected to the output terminal of the inverter INV18 to receive an output signal of the inverter INV18 which is a second control signal. The second input terminal of the NAND gate NAND32 is referred to as a control input terminal 32A.

The inversion response times of the inverters INV-19–INV31 are designed as follows. With respect to the inverters INV20, INV22, . . . , and INV30 at even stages, the outputting of a falling pulse edge is quicker than the outputting of a rising pulse edge. On the other hand, with respect to the inverters INV19, INV21, . . . , and INV31 at odd stages, the outputting of a rising pulse edge is quicker than the outputting of a falling pulse edge.

Figure 2:
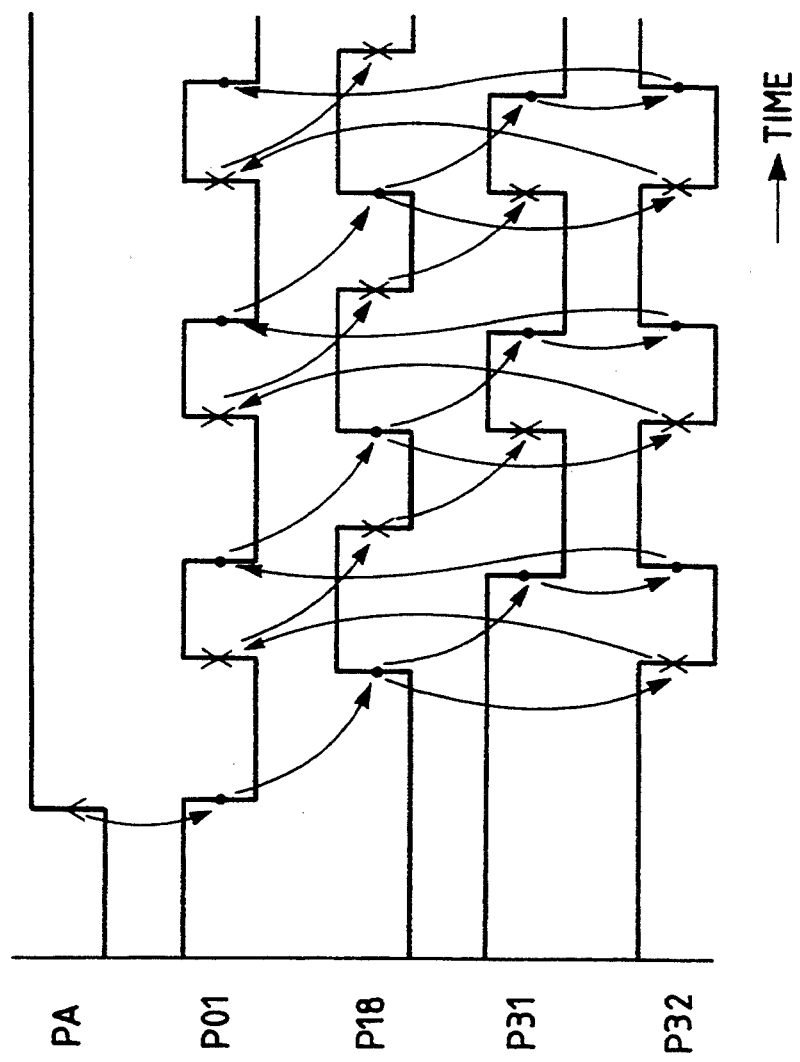
FIG. 2 is a time-domain diagram of various signals in the ring oscillator of FIG. 1.

The ring oscillator 2 of FIG. 1 operates as follows. Under initial conditions, the start pulse signal PA remains at a low level while the output signal P01 of the NAND gate NAND1 continues to be at a high level as shown in FIG. 2. Thus, the output signals of the inverters INV2, INV4, . . . , and INV30 at even stages counted from the NAND gate NAND1 remain at low levels while the output signals of the inverters INV3, INV5, . . . , and INV31 at odd stages remain at high levels. Under the initial conditions, the inverter INV18 outputs a low-level signal to the control input terminal 32A of the NAND gate NAND32 and the inverter INV31 outputs a high-level signal to the other input terminal of the NAND gate NAND32 so that the NAND gate 32 outputs a high-level signal although it occupies an even stage. Thus, one of the input terminals of the NAND gate NAND1 receives the high-level signal from the NAND gate NAND32 while the other input terminal thereof receives the low-level signal PA. Accordingly, the NAND gate NAND1 is enabled to start state-changing operation in response to a change of the start pulse signal PA from the low level to a high level.

When the start pulse signal PA changes from the low level to the high level, the initial conditions terminate and a first process starts. Specifically, the change of the start pulse signal PA from the low level to the high level causes the output signal P01 of the NAND gate NAND1 to be changed from the high level to a low level as shown in FIG. 2 so that the output signals of the inverters INV2, INV3, . . . , and INV31 are sequentially changed during the first and later processes. Specifically, the output signals of the inverters INV2, INV4, . . . , and INV30 at the even stages sequentially change from the low levels to high levels while the output signals of the inverters INV3, INV5, . . . , and INV31 at the odd stages sequentially change from the high levels to low levels. In this way, the NAND gate NAND1, the inverters INV2, INV3, . . . , and INV31, and the NAND gate NAND32 sequentially execute state changes in response to the change of the start pulse signal PA from the low level to the high level. During the sequential state changes, a pulse edge is circulated in the ring oscillator 2 as a falling pulse edge outputted from each of the NAND gate NAND1 and the inverters INV3, INV5, . . . , and INV31 at the odd stages and a rising pulse edge outputted from each of the inverters INV2, INV4, . . . , and INV30 and the NAND gate NAND32 at the even stages. This circulated pulse edge is referred to as a main pulse edge which is denoted by dots in FIG. 2.

When the main pulse edge reaches the output terminal of the inverter INV18 for the first time, the first process terminates and a second process starts. The main pulse edge outputted from the inverter INV18 is divided into two directed to the NAND gate NAND32 and the inverter INV19 respectively. The main pulse edge travels from the inverter INV18 to the NAND gate NAND32 via the connection between the output terminal of the inverter INV18 and the control input terminal 32A of the NAND gate NAND32 which forms a "short" route. At the start of the second process, the output signal P18 of the inverter INV18 is changed from the low level to the high level by the main pulse edge as shown in FIG. 2. At this moment, since the output signal P31 of the inverter INV31 is in the high-level state, both the two signals inputted into the NAND gate NAND32 from the inverters INV18 and INV31 assume the high-level states. As a result, the NAND gate NAND32 starts state-change operation and the output signal P32 thereof changes from the high level to the low level as shown in FIG. 2. In this way, the main pulse edge inputted into the NAND gate NAND32 from the inverter INV18 via the control input terminal 32A passes through the NAND gate NAND32 while being inverted thereby during the second process. Then, the output signals of the NAND gate NAND1 and the inverters INV2, INV3, ..., and INV31 are sequentially inverted while the pulse edge is circulated in the ring oscillator 2 during later processes. Specifically, the output signals of the NAND gate NAND1 and the inverters INV3, INV5, ..., and INV31 at the odd stages sequentially change from the low levels to the high levels while the output signals of the inverters INV2, INV4, ..., and INV30 at the even stages sequentially change from the high levels to the low levels. In this way, the NAND gate NAND32, the NAND gate NAND1, and the inverters INV2, INV3, ..., and INV31 sequentially perform state changes in response to the main pulse edge inputted into the NAND gate NAND32 from the inverter INV18 via the control input terminal 32A. During the sequential state-changes, a pulse edge is circulated in the ring oscillator 2 as a rising pulse edge outputted from each of the NAND gate NAND1 and the inverters INV3, INV5, ..., and INV31 at the odd stages and a falling pulse edge outputted from each of the NAND gate NAND32 and the inverters INV2, INV4, ..., and INV30 at the even stages. This circulated pulse edge is referred to as a reset pulse edge which is denoted by crosses in FIG. 2.

As understood from FIG. 2, the main pulse edge denoted by the dots and the reset pulse edge denoted by the crosses are circulated in the ring oscillator 2.

As previously described, the main pulse edge outputted from the inverter INV18 is divided into two directed to the NAND gate NAND32 and the inverter INV19 respectively. During a third process which is partially parallel with the second process, the main pulse edge travels from the inverter INV18 to the inverter INV19. The main pulse edge sequentially passes through the inverters INV19, INV20, ..., and INV31 while being inverted thereby. The signal flow path between the inverter INV18 and the NAND gate NAND32 which includes the serial combination of the inverters INV19, INV20, ..., and INV31 is referred to as a "normal" route. When the main pulse edge reaches the output terminal of the inverter INV31 via the normal route, the output signal P31 of the inverter INV31 changes from the high level to the low level as shown in FIG. 2. At this moment, since the output signal P18 of the inverter INV18 is in the high-level state, both the two signals inputted into the NAND gate NAND32 from the inverters INV18 and INV31 assume the high-level states. As a result, the NAND gate NAND32 starts state-change operation and the output signal P32 thereof changes from the low level to the high level as shown in FIG. 2. In this way, the main pulse edge inputted into the NAND gate NAND32 from the inverter INV31 passes through the NAND gate NAND32 while being inverted thereby. Then, the main pulse edge circulates in the ring oscillator 2 while being inverted by the NAND gate NAND1 and the inverters INV2, INV3, ..., and INV31.

As previously described, the output signal P18 of the inverter INV18 remains at the high level when the main pulse edge reaches the NAND gate NAND32 via the inverters INV19–INV31. This fact results for the following reason. The signal flow path from the inverter INV19 to the inverter INV31 has 13 inverting circuits. On the other hand, the signal flow path from the NAND gate NAND32 to the inverter INV18 has 19 inverting circuits. Thus, the main pulse edge starting from the inverter INV19 reaches the NAND gate NAND32 before the related reset pulse edge stating from the NAND gate NAND32 returns thereto via the connection between the control input terminal 32A and the inverter INV18 (via the short route).

During a fourth process subsequent to the second process, the reset pulse edge generated by the NAND gate NAND32 passes through the NAND gate NAND1 and the subsequent inverters while being inverted thereby. When the reset pulse edge reaches the output terminal of the inverter INV18, the output signal P18 of the inverter INV18 changes from the high level to the low level as shown in FIG. 2. The change of the signal P 18 to the low level is applied to the NAND gate NAND32 via the control input terminal 32A (via the short route). The state of the NAND gate NAND32 does not change in response to the change of the signal P18 to the low level since the output signal P31 of the inverter INV31, which is applied to the other input terminal of the NAND gate NAND32, is previously changed to the low level by the main pulse edge as shown in FIG. 2. In this way, the reset pulse edge is prevented from traveling to the NAND gate NAND32 from the inverter INV18 via the control input terminal 32A (via the short route). The reset pulse edge enters the inverter INV19 from the inverter INV18 and then sequentially passes through the inverters INV-19–INV31 along the normal route while being inverted thereby. The reset pulse edge outputted from the inverter INV31 enters the NAND gate NAND32.

During a fifth process following the fourth process, when the reset pulse edge reaches the output terminal of the inverter INV31, the signal P31 outputted to the NAND gate NAND32 from the inverter INV31 changes from the low level to the high level as shown in FIG. 2. At approximately the same time, the main pulse edge reaches the output terminal of the inverter INV18 so that the signal P18 outputted to the NAND gate NAND32 from the inverter INV18 via the control input terminal 32A also changes from the low level to the high level as shown in FIG. 2.

The above-mentioned approximately simultaneous entrance of the main pulse edge and the reset pulse edge into the NAND gate NAND32 is caused by the following fact. As previously described, the main pulse edge starts from the NAND gate NAND1 and then sequentially passes through the inverters INV2–INV31 and the NAND gate NAND32 via the normal route, and subsequently returns to the NAND gate NAND1 and passes through the NAND gate NAND1. Thereafter, the main pulse edge sequentially passes through the inverters INV2–INV18, and then reaches the NAND gate NAND32 via the control input terminal 32A (via the short route). During the interval from the start to the second entrance into the NAND gate NAND32, the main pulse edge passes through 50 inverting circuits in total. On the other hand, the reset pulse edge is generated by the NAND gate NAND32 in response to the main pulse edge (referred to as the original pulse edge) which reaches the output terminal of the inverter INV18 and the control input terminal 32A for the first time after the start from the NAND gate NAND1. Then, the reset pulse edge sequentially passes through the NAND gate NAND1 and the inverters INV-2–INV31 via the normal route, and subsequently returns to the NAND gate NAND32. During the interval from the start of the original pulse edge to the entrance of the reset pulse edge into the NAND gate NAND32, the original pulse edge and the reset pulse edge pass through 50 inverting circuits in total. In this way, the total number of inverting circuits passed by the main pulse edge is equal to the total number of inverting circuits passed by the original pulse edge and the reset pulse edge.

As previously described, with respect to the inverters INV20, INV22, . . . , and INV30 at even stages, the outputting of a falling pulse edge is quicker than the outputting of a rising pulse edge. On the other hand, with respect to the inverters INV19, INV21, . . . , and INV31 at odd stages, the outputting of a rising pulse edge is quicker than the outputting of a falling pulse edge. This design enables the reset pulse edge to travel in the normal route at a higher speed. Therefore, in fact, the reset pulse edge reaches the NAND gate NAND32 immediately before the main pulse edge reaches the NAND gate NAND32.

Accordingly, at the moment of the inversion of the output signal P31 of the inverter INV31 from the low level to the high level by the reset pulse edge, the signal P18 applied to the control input terminal 32A of the NAND gate NAND32 from the inverter INV18 remains at the low level and thus the output signal P32 of the inverter INV32 is not changed. This means the disappearance of the reset pulse edge. Immediately thereafter, the main pulse edge reaches the output terminal of the inverter INV18 so that the signal P18 applied to the control input terminal 32A of the NAND gate NAND32 from the inverter INV18 changes from the low level to the high level. The change of the signal P18 from the low level to the high level causes the output signal P32 of the NAND gate NAND32 to be changed from the high level to the low level, so that a next reset pulse edge results from the main pulse edge as shown in FIG. 2. In this way, the reset pulse edge disappears in the NAND gate NAND32, and a subsequent reset pulse edge is generated by the NAND gate NAND32 in response to the main pulse edge immediately after the disappearance of the former reset pulse edge.

The generation of the subsequent reset pulse edge by the NAND gate NAND32 in response to the main pulse edge is similar to the generation of the former reset pulse edge by the NAND gate NAND32 in response to the main pulse edge which occurs during the previously-mentioned second process. The subsequent reset pulse edge travels from the NAND gate NAND32 to the NAND gate NAND1 while the main pulse edge travels from the inverter INV18 toward the inverter INV31 along the normal route. Then, the main pulse edge and the subsequent reset pulse edge circulate in the ring oscillator 2 as the main pulse edge and the former reset pulse edge do in the previous period.

During a later period, the previously-mentioned third to fifth processes are reiterated until stopping conditions occur. Thus, a reset pulse edge is periodically generated and disappears at a period corresponding to one complete revolution or circulation of the main pulse edge in the ring oscillator 2 via the normal route. After the reset pulse edge is generated but before the disappearance thereof, the reset pulse edge circulates in the ring oscillator 2 as the main pulse edge does.

When the start pulse signal PA is returned from the high level to the low level as stopping conditions, the initial conditions are retrieved. The return of the start pulse signal PA to the low level holds the output signal P01 of the NAND gate NAND1 at the high level independent of any change in the state of the output signal P32 of the NAND gate NAND32, so that the main pulse edge and the reset pulse edge are prevented from passing through the NAND gate NAND1.

In a simple ring combination of an even number of inverting circuits, it is generally difficult for a pulse edge to circulate therein since stable conditions (non-oscillating conditions) tend to occur where signals inputted into and outputted from each inverting circuit have different levels respectively. On the other hand, the ring oscillator 2 of this embodiment is prevented from falling into stable conditions (non-oscillating conditions) before the stopping conditions occur. Specifically, in the ring oscillator 2, the main pulse edge and the reset pulse edge circulate while being positionally spaced. The output signal P01 of the NAND gate NAND1 is changed by the reset pulse edge before the main pulse edge generated by the NAND gate NAND1 returns to the NAND gate NAND1. In addition, the output signal P32 of the NAND gate NAND32 is changed by the main pulse edge before the reset pulse edge generated by the NAND gate NAND32 returns to the NAND gate NAND32. These processes prevent the ring oscillator 2 from falling into stable conditions (non-oscillating conditions). Therefore, the main pulse edge and the reset pulse edge continue to circulate before the stopping conditions occur.

As previously described, with respect to the inverters INV20, INV22, . . . , and INV30 at the even stages, the outputting of a falling pulse edge is quicker than the outputting of a rising pulse edge. On the other hand, with respect to the inverters INV19, INV21, . . . , and INV31 at the odd stages, the outputting of a rising pulse edge is quicker than the outputting of a falling pulse edge. Therefore, in fact, the reset pulse edge reaches the NAND gate NAND32 immediately before the main pulse edge reaches the NAND gate NAND32. Accordingly, at the moment of the inversion of the output signal P31 of the inverter INV31 from the low level to the high level by the reset pulse edge, the signal P18 applied to the control input terminal 32A of the NAND gate NAND32 from the inverter INV18 remains at the low level and thus the output signal P32 of the inverter INV32 is not changed. This means the disappearance of the reset pulse edge. Immediately thereafter, the main pulse edge reaches the output terminal of the inverter INV18 so that the signal P18 applied to the control input terminal 32A of the NAND gate NAND32 from the inverter INV18 changes from the low level to the high level. The change of the signal P18 from the low level to the high level causes the output signal P32 of the NAND gate NAND32 to be changed from the high level to the low level, so that a next reset pulse edge results from the main pulse edge. In this way, the reset pulse edge disappears in the NAND gate NAND32, and a subsequent reset pulse edge is generated by the NAND gate NAND32 in response to the main pulse edge immediately after the disappearance of the former reset pulse edge.

Figure 8:
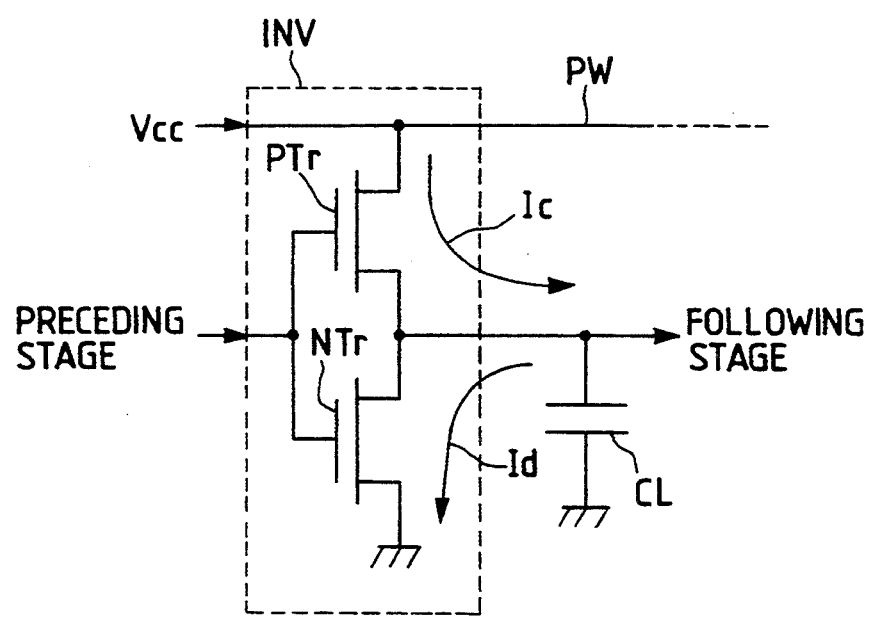
FIG. 8 is a schematic diagram of an inverter in the ring oscillator of FIG. 1.

The inverters INV2–INV18 and also the inverters INV19–INV31 are of structures including CMOS circuits. As shown in FIG. 8, an inverter INV which corresponds to each of the inverters INV2–INV31 has a pair of a p-type MOS field-effect transistor PTr and an n-type MOS field-effect transistor NTr. The source-drain path of the p-type transistor Frr and the source-drain path of the n-type transistor NTr are connected in series. The combination of the source-drain paths of the transistors PTr and NTr is connected between a power feed line PW and the ground. The power feed line PW is subjected to a given positive power supply voltage Vcc. The gates of the transistors PTr and NTr are connected in common to a preceding stage. The sources of the transistors PTr and NTr are connected in common to a following stage. A parasitic capacitance CL is inevitably connected between the output side of the inverter INV and the ground.

It is well-known in the art that such a parasitic capacitance slows down a change of the output signal of an inverter in response to a change of the input signal thereto. The speed of the change of the output signal from a low level to a high level (a rising pulse edge) is generally determined by the rate of charging the parasitic capacitance CL. The speed of the change of the output signal from the high level to the low level (a falling pulse edge) is generally determined by the rate of discharging the parasitic capacitance CL. The parasitic capacitance CL is charged by a drain current Ic through the p-type transistor PTr. The drain current Ic depends on the dimensions or the size of the p-type transistor PTr, and specifically on the ratio (size ratio) between the width and the length of the p-type transistor PTr. The parasitic capacitance CL is discharged by a drain current Id of the n-type transistor NTr. The drain current Id depends on the dimensions or the size of the n-type transistor NTr, and specifically on the ratio (size ratio) between the width and the length of the n-type transistor NTr. Accordingly, the speed of the change of the output signal from the low level to the high level and also the speed of the change of the output signal from the high level to the low level depend on the size ratios of the p-type transistor PTr and the n-type transistor NTr.

In each of the inverters INV20, INV22, . . . , and INV30 at the even stages, the size ratios of the p-type transistor PTr and the n-type transistor NTr are chosen so that the outputting of a falling pulse edge will be quicker than the outputting of a rising pulse edge. On the other hand, in each of the inverters INV19, INV21, . . . , and INV31 at the odd stages, the size ratios of the p-type transistor PTr and the n-type transistor NTr are chosen so that the outputting of a rising pulse edge will be quicker than the outputting of a falling pulse edge.

For example, in each of the inverters INV20, INV22, . . . , and INV30 at the even stages, the width/length ratio of the p-type transistor PTr is equal to 8/1 while the width/length ratio of the n-type transistor NTr is equal to 4.6/1. For example, in each of the inverters INV19, INV21, . . . , and INV31 at the odd stages, the width/length ratio of the p-type transistor PTr is equal to 9.2/1 while the width/length ratio of the n-type transistor NTr is equal to 4/1.

In an assumed case where the main pulse edge reaches the NAND gate NAND32 immediately before the reset pulse edge reaches the NAND gate NAND32 during the fifth process, the output signal P32 of the NAND gate NAND32 changes in response to the reset pulse edge so that the reset pulse edge does not disappear and passes through the NAND gate NAND32. In the assumed case, there is a chance that the main pulse edge catches up with the reset pulse edge and finally stable conditions (non-oscillating conditions) occur. Thus, the reiterative generation and disappearance of the reset pulse edge prevent the ring oscillator 2 from falling into stable conditions (non-oscillating conditions).

Although the ring oscillator 2 has a ring combination of an even number of inverting circuits, the ring oscillator 2 is therefore prevented from falling into stable conditions (non-oscillating conditions) and the main pulse edge and the reset pulse edge continue to circulate therein before stopping conditions occur. In addition, the main pulse edge and the reset pulse edge stably circulate without being affected by a variation among response times of the inverting circuits. Thus, for example, the output signal of the NAND gate NAND1 can be used as an accurate clock signal having a period equal to 32 times the operation delay time of each inverting circuit.

In the ring oscillator 2 of this embodiment, the NAND gate NAND1 is a first inverting circuit for start, and the NAND gate NAND32 is a second inverting circuit for start. The second inverting circuit NAND32 occupies the 32-nd stage counted from the first inverting circuit NAND1 at the first stage. The output signal of the inverter INV18 is used as a second control signal applied to the NAND gate NAND32.

Second Specific Embodiment

A ring oscillator of a second specific embodiment of this invention is similar to the ring oscillator 2 of the first specific embodiment except for design changes indicated hereinafter.

In the second specific embodiment, a NAND gate forming a second inverting circuit for start occupies the 20-th stage, and the output signal of an inverter INV16 is used as a second control signal applied to the NAND gate at the 20-th stage.

Third Specific Embodiment

A ring oscillator of a third specific embodiment of this invention is similar to the ring oscillator 2 of the first specific embodiment except for design changes indicated hereinafter.

In the third specific embodiment, first and second inverting circuits for start use NOR gates respectively. In addition, initial conditions terminate in response to the change of a start pulse signal PA from a high level to a low level. The initial conditions are retrieved by the change of the start pulse signal PA from the low level to the high level. The directions of a main pulse edge and a reset pulse edge are opposite to those of the main pulse edge and the reset pulse edge in the first specific embodiment.

Fourth Specific Embodiment

A ring oscillator of a fourth specific embodiment of this invention is similar to the ring oscillator 2 of the first specific embodiment except for design changes indicated hereinafter.

In the fourth specific embodiment, a second inverting circuit for start uses a NOR gate and occupies the 31-st stage, and the output signal of an inverter INV17 is used as a second control signal applied to the NOR gate at the 31-st stage.

Fifth Specific Embodiment

A ring oscillator of a fifth specific embodiment of this invention is similar to the ring oscillator 2 of the first specific embodiment except for design changes indicated hereinafter.

In the fifth specific embodiment, a first inverting circuit for start uses one of a NAND gate and a NOR gate, and also a second inverting circuit for start uses one of a NAND gate and a NOR gate. In addition, the output signal of a given inverter is used as a second control signal applied to the second inverting circuit for start. The total number of inverting circuits connected between the second inverting circuit for start and the given inverter is an odd number equal to or smaller than a half of the total number of all the inverting circuits in the ring oscillator. The first inverting circuit for start is located between the second inverting circuit for start and the given inverter.

Sixth Specific Embodiment

A ring oscillator of a sixth specific embodiment of this invention is similar to the ring oscillator 2 of the first specific embodiment except for design changes indicated hereinafter.

The direct connection between a NAND gate NAND32 and an inverter INV18 is omitted from the sixth specific embodiment. In addition, the sixth specific embodiment includes a delay circuit for delaying a start pulse signal PA. The delay circuit has a series combination of 18 inverters. The output signal of the delay circuit is used as a second control signal applied to the NAND gate NAND32.

In the ring oscillator of the sixth specific embodiment, a main pulse edge generated by a NAND gate NAND1 and a reset pulse edge generated by the NAND gate NAND32 can circulate before stopping conditions occur.

In the presence of a variation among inversion response times of the NAND gates and the inverters, there is a chance that the main pulse edge and the reset pulse edge disappear. The disappearance of the main pulse edge and the reset pulse edge results from the fact that the main pulse edge catches up with the reset pulse edge or the reset pulse edge catches up with the main pulse edge as they circulate.

Accordingly, the variation among the inversion response times of the NAND gates and the inverters can be evaluated by measuring the interval between the moment of the start of the ring oscillator and the moment of the disappearance of the main pulse edge and the reset pulse edge.

The ring oscillator of the sixth specific embodiment may be made in an LSI chip having a package provided with an input terminal for feeding the start pulse signal PA and a test terminal for detecting an output signal of a given inverter. In this case, the variation among the inversion response times of the NAND gates and the inverters, that is, a variation among characteristics of transistors composing the NAND gates and the inverters, can be evaluated by monitoring the signals at the input terminal and the test terminal and thereby measuring the interval between the moment of the start of the ring oscillator and the moment of the disappearance of the main pulse edge and the reset pulse edge. This evaluation is enabled without using an expensive testing device such as an LSI tester.

Seventh Specific Embodiment

Figure 7:
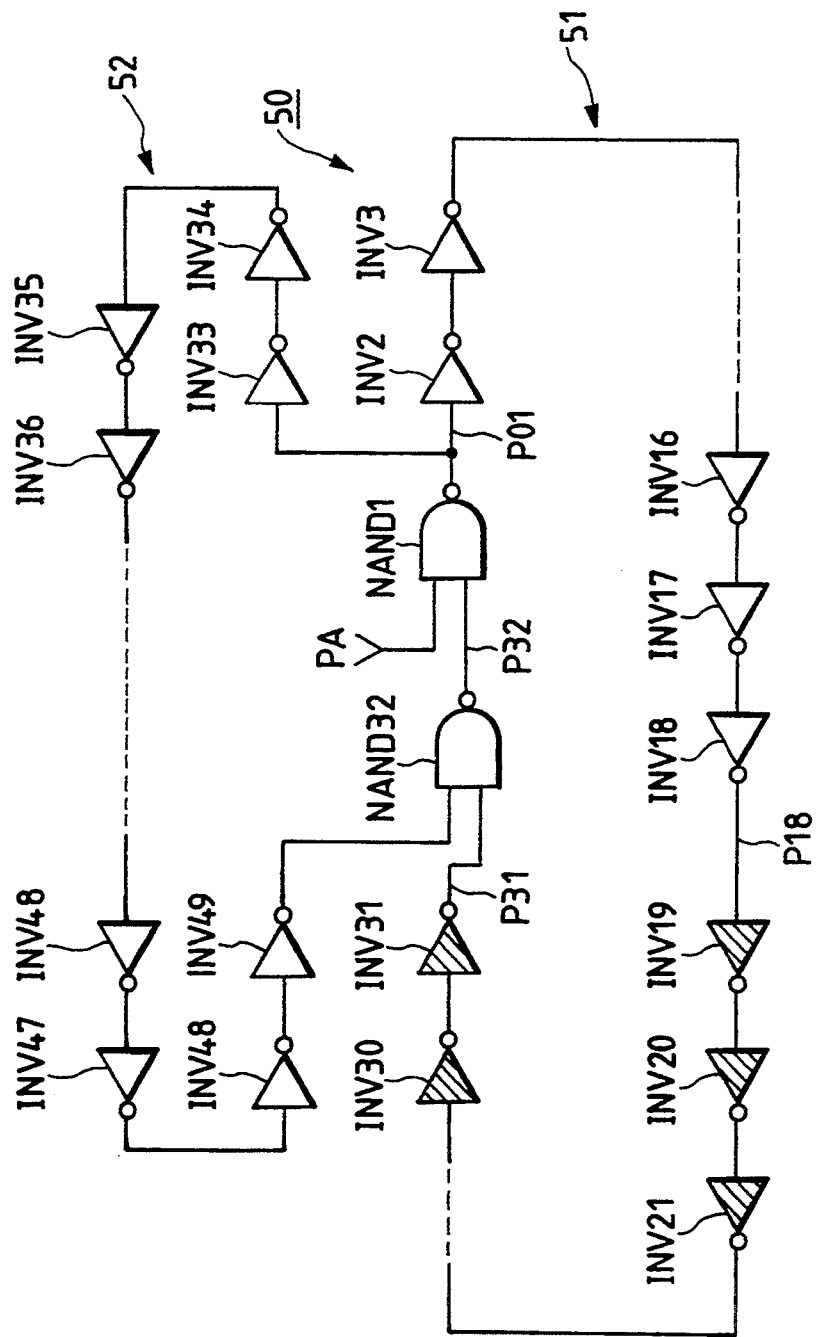
FIG. 7 is a diagram of a ring oscillator according to a seventh specific embodiment of this invention.

FIG. 7 shows a ring oscillator 50 of a seventh specific embodiment of this invention which is similar to the ring oscillator 2 of the first specific embodiment except for design changes indicated hereinafter.

As shown in FIG. 7, the ring oscillator 50 includes first and second rings 51 and 52. The first ring 51 has a ring or loop combination of a given even number of inverting circuits forming respective stages. The first ring 51 corresponds to the ring oscillator 2 of FIG. 1 except that the direct connection between a NAND gate NAND32 and an inverter INV18 is omitted therefrom. The second ring 52 has a ring or loop combination of a given odd number of inverting circuits forming respective stages.

The signal flow path including the NAND gate NAND32 and a NAND gate NAND1 is common to the first and second rings 51 and 52. Specifically, the output terminal of the NAND gate NAND1 is connected to a first input terminal of the NAND gate NAND32 via a sequential combination of inverters INV33, INV34, . . . , and INV49. A second input terminal of the NAND gate NAND32 follows the output terminal of the inverter INV31. The NAND gate NAND1, the inverters INV33, INV34, . . . , and INV49, and the NAND gate NAND32 compose the second ring 52.

A main pulse edge generated by the NAND gate NAND1 travels to the inverter INV33 and then sequentially passes through the inverters INV33–INV49 in the second ring 52 before reaching the NAND gate NAND32. When the main pulse edge reaches the NAND gate NAND32 via the inverters INV-33–INV49, the NAND gate NAND32 generates a reset pulse edge.

The main pulse edge and the reset pulse edge circulate in the first ring 51 as the main pulse edge and the reset pulse edge do in the ring oscillator 2 of the first specific embodiment.

Eighth Specific Embodiment

Figure 3:
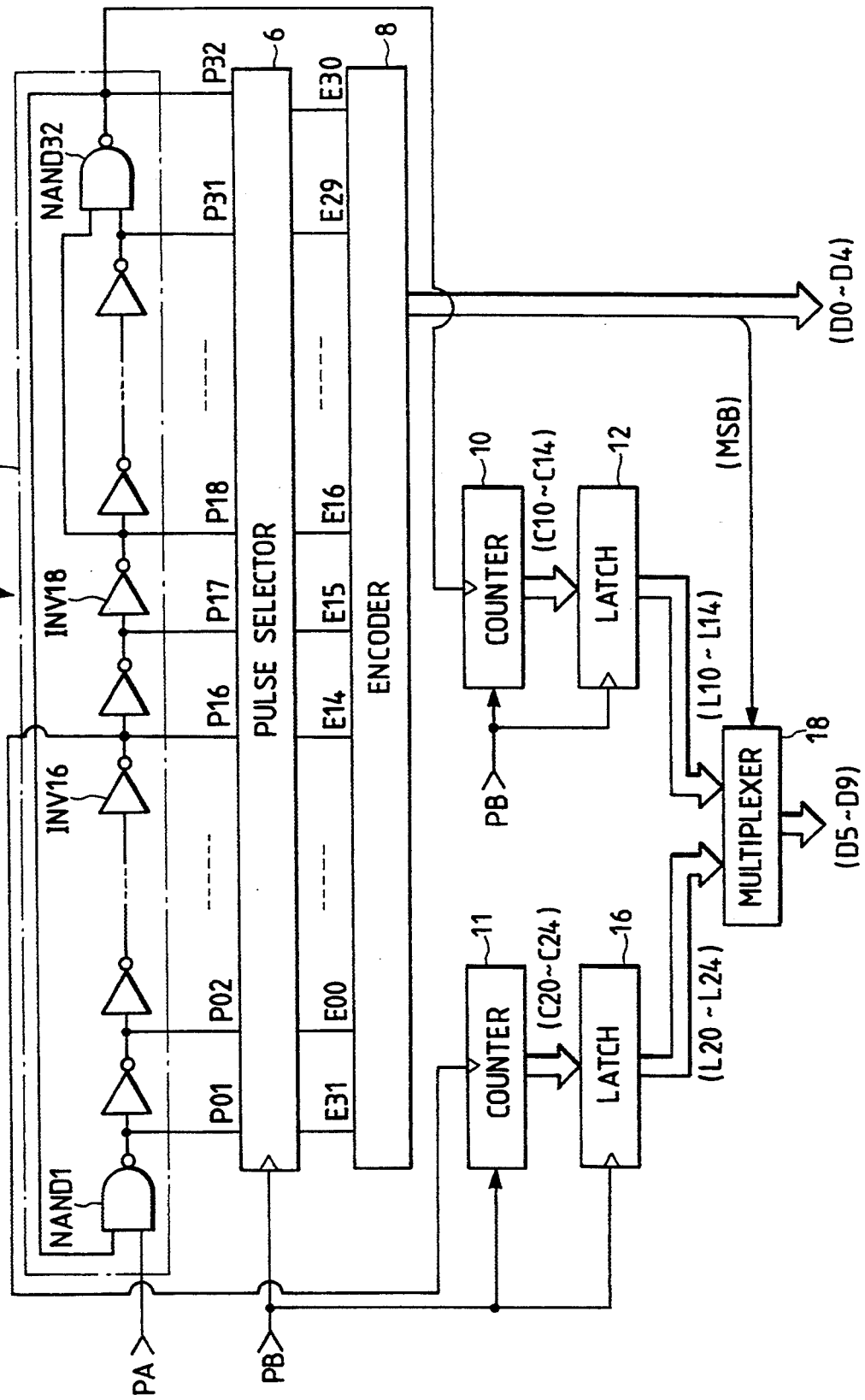
FIG. 3 is a block diagram of a pulse phase difference encoding circuit according to an eighth specific embodiment of this invention.

With reference to FIG. 3, a pulse phase difference encoding circuit 4 includes the ring oscillator 2 of the first specific embodiment. It should be noted that the ring oscillator 2 may be replaced by one of the ring oscillators of the second, third, fourth, fifth, sixth, and seventh specific embodiments. As previously, described, the ring oscillator 2 starts to operate in response to a start pulse signal PA, that is, a first control signal or a first input signal. During the operation of the ring oscillator 2, a main pulse edge and a reset pulse edge circulate therein.

The pulse phase difference encoding circuit 4 also includes a pulse selector 6, an encoder 8, a first counter 10, a first latch circuit 12, a second counter 14, a second latch circuit 16, and a multiplexer 18.

The pulse selector 6 receives the output signals P01, P02, P03, . . . , P31, and P32 of the NAND gate NAND1, the inverter INV2, the inverter INV3, . . . , the inverter INV31, and the NAND gate NAND32 in the ring oscillator 2 respectively. The pulse selector 6 also receives a latch pulse signal PB which is a second input signal. The pulse selector 6 detects which of the inverting circuits in the ring oscillator 2 the main pulse edge reaches, that is, the position of the main pulse edge in the ring oscillator 2, by referring to the output signals P01–P32 of the ring oscillator 2 at a moment determined by the latch pulse signal PB. Thus, the pulse selector 6 serves as a pulse position detecting device.

The encoder 8 receives output signals E00, E01, . . . , and E31 of the pulse selector 6, and encodes the received signals into a 5-bit digital signal D0–D4 representing the order number of the stage of the inverting circuit detected by the pulse selector 6. The order number of the stage is defined as being counted from the NAND gate NAND1 in the ring oscillator 2. The encoder 8 is designed to recognize a low level in each of the output signals E00–E31 of the pulse selector 6 as "active".

The first counter 10 receives the output signal P32 of the NAND gate NAND32 in the ring oscillator 2, and counts and detects the number of times of the passage of the main pulse edge through the NAND gate NAND32. The second counter 14 receives the output signal P16 of the inverter INV16 in the ring oscillator 2, and counts and detects the number of times of the passage of the main pulse edge through the inverter INV16.

The first latch circuit 12 samples and holds a 5-bit output signal C10–C14 of the first counter 10 at a timing determined by the latch pulse signal PB. The second latch circuit 16 samples and holds a 5-bit output signal C20–C24 of the second counter 14 at a timing determined by the latch pulse signal PB.

The multiplexer 18 receives a 5-bit output signal L10–L14 of the first latch circuit 12 and a 5-bit output signal L20–L24 of the second latch circuit 16. The multiplexer 18 also receives the MSB, that is, the highest bit D4, of the 5-bit output signal D0–D4 of the encoder 8. The multiplexer 18 selects one of the output signal L10–L14 of the first latch circuit 12 and the output signal L20–L24 of the second latch circuit 16 in response to the value or level (logic state) of the MSB of the output signal D0–D4 of the encoder 8. The multiplexer 18 outputs the selected signal as a 5-bit digital signal D5–D9.

Figure 4:
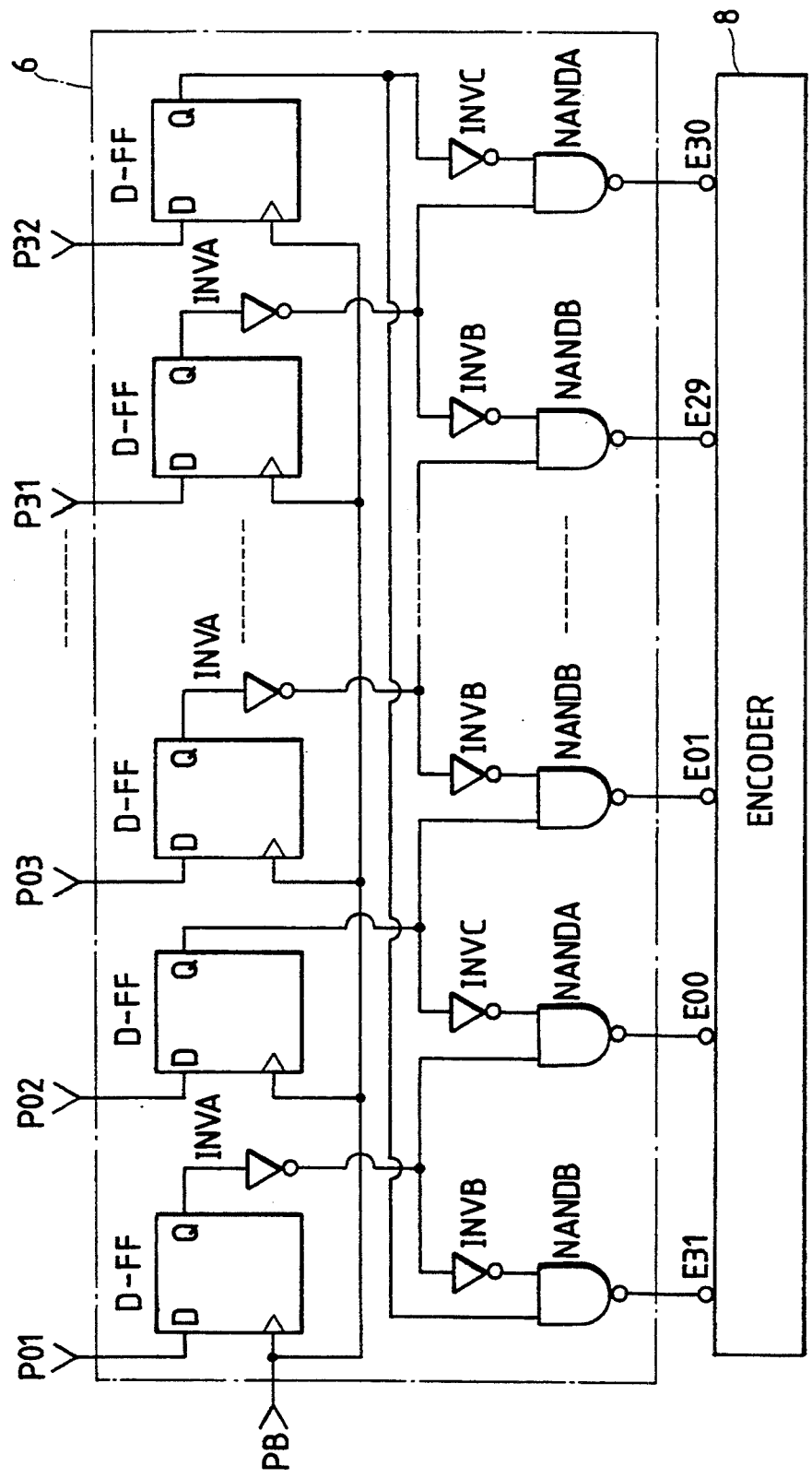
FIG. 4 is a block diagram of a pulse selector in the pulse phase difference encoding circuit of FIG. 3.

As shown in FIG. 4, the pulse selector 6 includes 32 D flip-flops "D-FF", a first group of 16 inverters "INVA", a second group of 16 inverters "INVB", a third group of 16 inverters "INVC", a first group of 16 two-input NAND gates "NANDA", and a second group of 16 two-input NAND gates "NANDB". The data input terminals of the D flip-flops D-FF are subjected to the output signals P01–P32 of the ring oscillator 2 respectively. The clock input terminals of the D flip-flops D-FF are subjected in common to the latch pulse signal PB. The input terminals of the inverters INVA are connected to the output terminals of the D flip-flops D-FF receiving the odd-stage output signals P01, P03, . . . , and P31 of the ring oscillator 2 respectively. The input terminals of the inverters INVB are connected to the output terminals of the inverters INVA respectively. The input terminals of the inverters INVC are connected to the output terminals of the D flip-flops D-FF receiving the even-stage output signals P02, P04, . . . , and P32 of the ring oscillator 2 respectively. First input terminals of the NAND gates NANDA receive the output signals of the inverters INVA related to the odd stages of the ring oscillator 2 respectively, and second input terminals thereof receive the output signals of the inverters INVC related to the subsequent even stages of the ring oscillator 2 respectively. The output signals of the NAND gates NANDA are applied to the encoder 8 as the output signals E00, E02, . . . , and E30 of the pulse selector 6. First input terminals of the NAND gates NANDB receive the output signals of the D flip-flops D-FF related to the even stages of the ring oscillator 2 respectively, and second input terminals thereof receive the output signals of the inverters INVB related to the subsequent odd stages of the ring oscillator 2 respectively. The output signals of the NAND gates NANDB are applied to the encoder 8 as the output signals E01, E03, . . . , and E31 of the pulse selector 6.

The pulse phase difference encoding circuit 4 operates as follows. When the start pulse signal PA assumes the low level, the ring oscillator 2 falls into the stable state (non-oscillating state) and thus goes inactive. When the start pulse signal PA changes from the low level to the high level, the ring oscillator 2 starts to operate and simultaneously a main pulse edge is generated. During the operation of the ring oscillator 2, the main pulse edge circulates therein.

Figure 5:
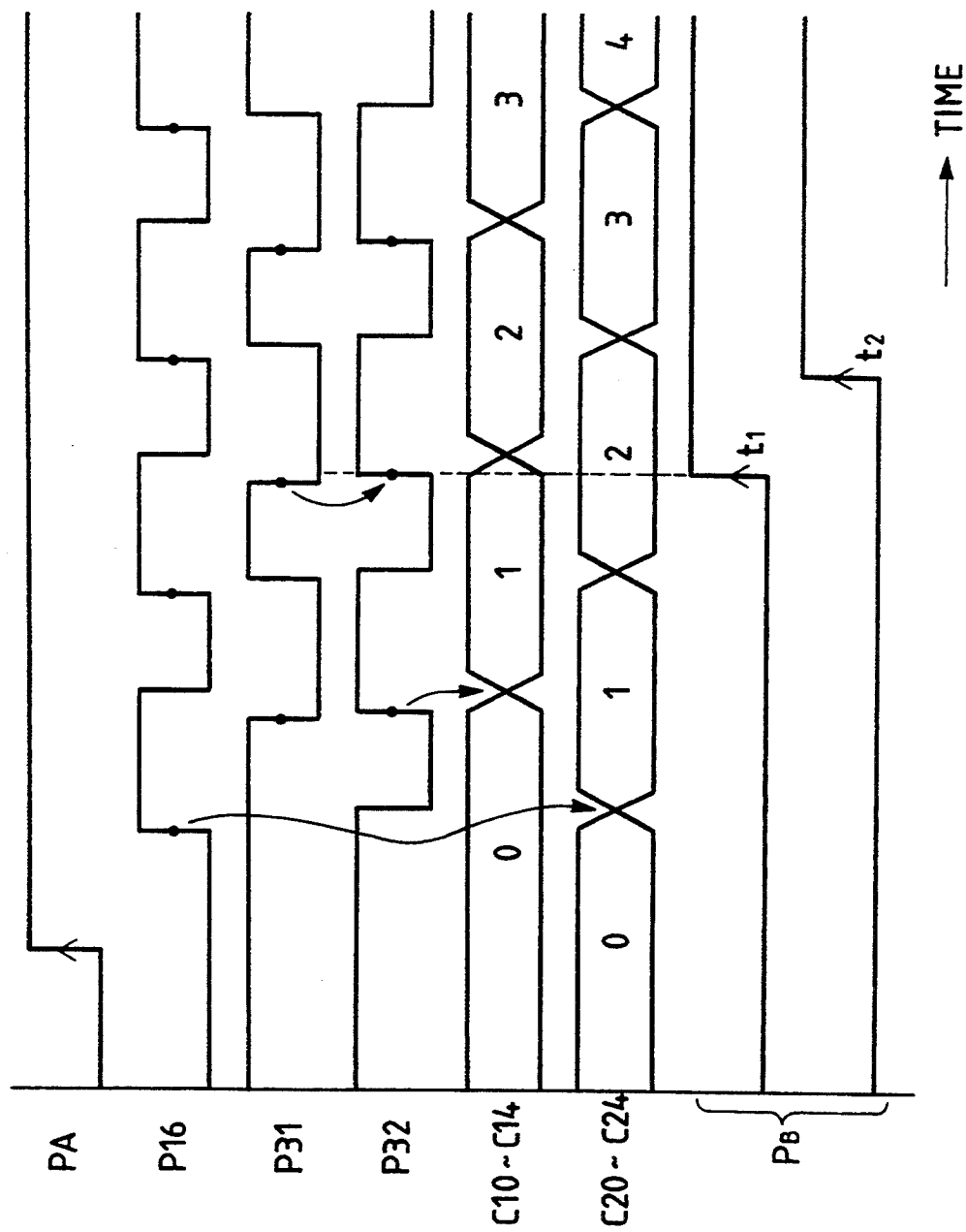
FIG. 5 is a time-domain diagram of various signals in the pulse phase difference encoding circuit of FIG. 3.

As shown in FIG. 5, when the main pulse edge passes through the inverter INV16 at the 16-th stage in the ring oscillator 2, the second counter 14 executes a count-up process so that the value represented by the output signal C20–C24 thereof increases from "0" to "1". It should be noted that the main pulse edge is denoted by dots in FIG. 5. During a subsequent period, when the main pulse edge passes through the NAND gate NAND32 at the 32-nd stage in the ring oscillator 2, the first counter 10 executes a count-up process so that the value represented by the output signal C10–C14 thereof increases from "0" to "1". Thus, the timing of each change in the output signals C10–C14 of the first counter 10 and the timing of each change in the output signal C20–C24 of the second counter 14 are separate from each other by an interval for which the main pulse edge travels a half of the signal flow loop in the ring oscillator 2.

In the case where the main pulse edge circulates in the ring oscillator 2, when a rising edge occurs in the latch pulse signal PB, the first and second latch circuits 12 and 16 sample and hold the output signals C10–C14 and C20–C24 of the first and second counters 10 and 14 respectively. Immediately thereafter, the output signals C10–C14 and C20–C24 of the first and second counters 10 and 14 are reset to "0" states by the rising edge in the latch pulse signal PB.

The D flip-flops in the pulse selector 6 latch the output signals P01–P32 of the ring oscillator 2 in response to the rising edge in the latch pulse signal PB, and output the latched signals respectively.

It is now assumed that the timing of the rising edge in the latch pulse signal PB is equal to a timing ta of FIG.

5 at which the main pulse edge is in the position of the inverter INV31 of the 31-st stage in the ring oscillator 2. At the moment t1, the output signal P31 of the inverter INV31 has already changed to the low level but the output signal P32 of the NAND gate NAND32 remains at the low level, so that only the output signal E30 of the NAND gate related to the 31-st stage and the 32-nd stage of the ring oscillator 2 is in the low-level state among the output signals E00-E31 of the NAND gates in the pulse selector 6. Thus, at the moment t1, the low-level signal E30 and the high-level signals E00-E29, and E31 are outputted from the pulse selector 6 to the encoder 8.

The main pulse edge travels and circulates in the ring oscillator 2 as a falling pulse edge outputted from each of the inverting circuits at the odd stages and a rising pulse edge outputted from each of the inverting circuits at the even stages. In addition, when the main pulse edge moves from each odd-stage inverting circuit to the next even-stage inverting circuit, both the output signals of the two inverting circuits assume the low levels. On the other hand, when the main pulse edge moves from each even-stage inverting circuit to the next odd-stage inverting circuit, both the output signals of the two inverting circuits assume the high levels. By referring to these conditions depending on the position of the main pulse edge in the ring oscillator 2, the pulse selector 6 detects the order number of the stage of the inverting circuit which the main pulse edge reaches, that is, the position of the main pulse edge. To realize the detection of the position of the main pulse edge, the pulse selector 6 is designed as follows. Specifically, in the pulse selector 6, the output signals of the D flip-flops D-FF related to the odd stages of the ring oscillator 2 and the output signals of the D flip-flops D-FF related to the subsequent even stages of the ring oscillator 2 are inverted by the inverters INVA and INVC, and the output signals of the inverters INVA and INVC are applied to the input terminals of the NAND gates NANDA. In addition, the output signals of the D flip-flops D-FF related to the even stages of the ring oscillator 2 and the output signals of the D flip-flops D-FF related to the subsequent odd stages of the ring oscillator 2 are applied to the input terminals of the NAND gates NANDB without being inverted. It should be noted that two inverters INVA and INVB connected between a NAND gate NANDB and a D flip-flop DFF related to an odd stage of the ring oscillator 2 cancel their inverting functions.

The encoder 8 converts the output signals E00, E01, ..., and E31 of the pulse selector 6 into the 5-bit digital signal D0-D4 representing the order number of the stage of the inverting circuit detected by the pulse selector 6. For example, in the case where only the signal E30 is in the low-level state but the other signals E00-E29, and E31 are in the high-level states, the output signal D0-D4 of the encoder 8 assumes a state of "11110" (the MSB output signal D4 of the encoder 8 assumes "1").

The MSB in the output signal D0-D4 of the encoder 8, that is, the signal D4, is fed to the multiplexer 18. When the signal D4 is "1", the multiplexer 18 selects the output signal L10-L14 of the first latch circuit 12 and outputs the selected signal as the signal D5-D9. When the signal D4 is "0", the multiplexer 18 selects the output signal L20-L24 of the second latch circuit 16 and outputs the selected signal as the signal D5-D9.

The output signal D4 of the encoder 8 depends on the position of the main pulse edge in the ring oscillator 2. Specifically, the output signal D4 of the encoder 8 is "0" when the main pulse edge exists in a position between the NAND gate NAND1 at the 1-st stage and the inverter INV16 at the 16-th stage. The output signal D4 of the encoder 8 is "1" when the main pulse edge exists in a position between the inverter INV17 at the 17-th stage and the NAND gate NAND32 at the 32-nd stage.

In the case where the rising edge occurs in the latch pulse signal PB at the timing t1 of FIG. 5, the main pulse edge reaches the inverter INV31 at the 31-st stage of the ring oscillator 2 at the moment t1 so that the output signal L10-L14 of the first latch circuit 12 assume a state of "00001" (a decimal state of 1, see FIG. 5). In addition, the output signal D4 of the encoder 8 is "1" as previously described. Therefore, in this case, the multiplexer 18 selects the output signal L10-L14 of the first latch circuit 12, and outputs "00001" as the signal D5-D9.

In the case where the rising edge occurs in the latch pulse signal PB at a timing t2 of FIG. 5, the main pulse edge has passed through the NAND gate NAND32 at the 32-nd stage and reaches a point preceding the inverter INV16 at the 16-th stage of the ring oscillator 2 at the moment t2 so that the output signal L20-L24 of the second latch circuit 16 assume a state of "00010" (a decimal state of 2, see FIG. 5). In addition, the output signal D4 of the encoder 8 is "0" as previously described. Therefore, in this case, the multiplexer 18 selects the output signal L20-L24 of the second latch circuit 16, and outputs "00010" as the signal D5-D9.

The pulse phase difference encoding circuit 4 is provided with the two counters 10 and 14, and the two latch circuits 12 and 16. The multiplexer 18 selects the output signal of the second latch circuit 16 when the main pulse edge exists in a position between the NAND gate NAND1 at the 1-st stage and the inverter INV16 at the 16-th stage of the ring oscillator 2. In addition, the multiplexer 18 selects the output signal of the first latch circuit 12 when the main pulse edge exists in a position between the inverter INV17 at the 17-th stage and the NAND gate NAND32 at the 32-nd stage of the ring oscillator 2. This two-system configuration in the pulse phase difference encoding circuit 4 is to compensate for the fact that the counters 10 and 14 are generally stabilized a certain time after the reception of signals counted thereby. Specifically, the multiplexer 18 selects the output signal of the stabler one of the counters 10 and 14 via a corresponding one of the latch circuits 12 and 16. In more detail, the multiplexer 18 selects a counter receiving the output signal of an inverting circuit which precedes the position of the main pulse edge by a length corresponding to at least a half of the signal flow loop in the ring oscillator 2, where the main pulse edge position occurs at the moment of the rising edge in the latch pulse signal PB.

The output signal D5-D9 of the multiplexer 18 and the output signal D0-D4 of the encoder 8 are used as 5 higher bits and 5 lower bits respectively which are combined into a 10-bit digital signal D0-D9 depending on the phase difference between the start pulse signal PA and the latch pulse signal PB. The value represented by the signal D0-D0 is multiplied by an operation delay time of each of the inverting circuits composing the ring oscillator 2, and the result of the multiplication agrees with the time difference between the rising edge in the start pulse signal PA and the rising edge in the latch pulse signal PB, that is, the phase difference between the start pulse signal PA and the latch pulse signal PB.

In the pulse phase difference encoding circuit 4 of this embodiment, the digital signal D5–D9 from the multiplexer 18 is directly used as higher bits of the digital signal D0–D9 representing the phase difference between the start pulse signal PA and the latch pulse signal PB. Thus, it is unnecessary to provide an operation device such as a subtracter for processing the digital signal D5–D9 to generate a part of a final phase difference signal. Since the pulse phase difference encoding circuit 4 has a simple design, it can be made into a small size. In the pulse phase difference encoding circuit 4, the outputting of the detected phase difference can be completed in a short time, and a high detection speed can be attained. Furthermore, the pulse phase difference encoding circuit 4 has a high resolution in the phase difference detection.

Ninth Specific Embodiment

Figure 6:
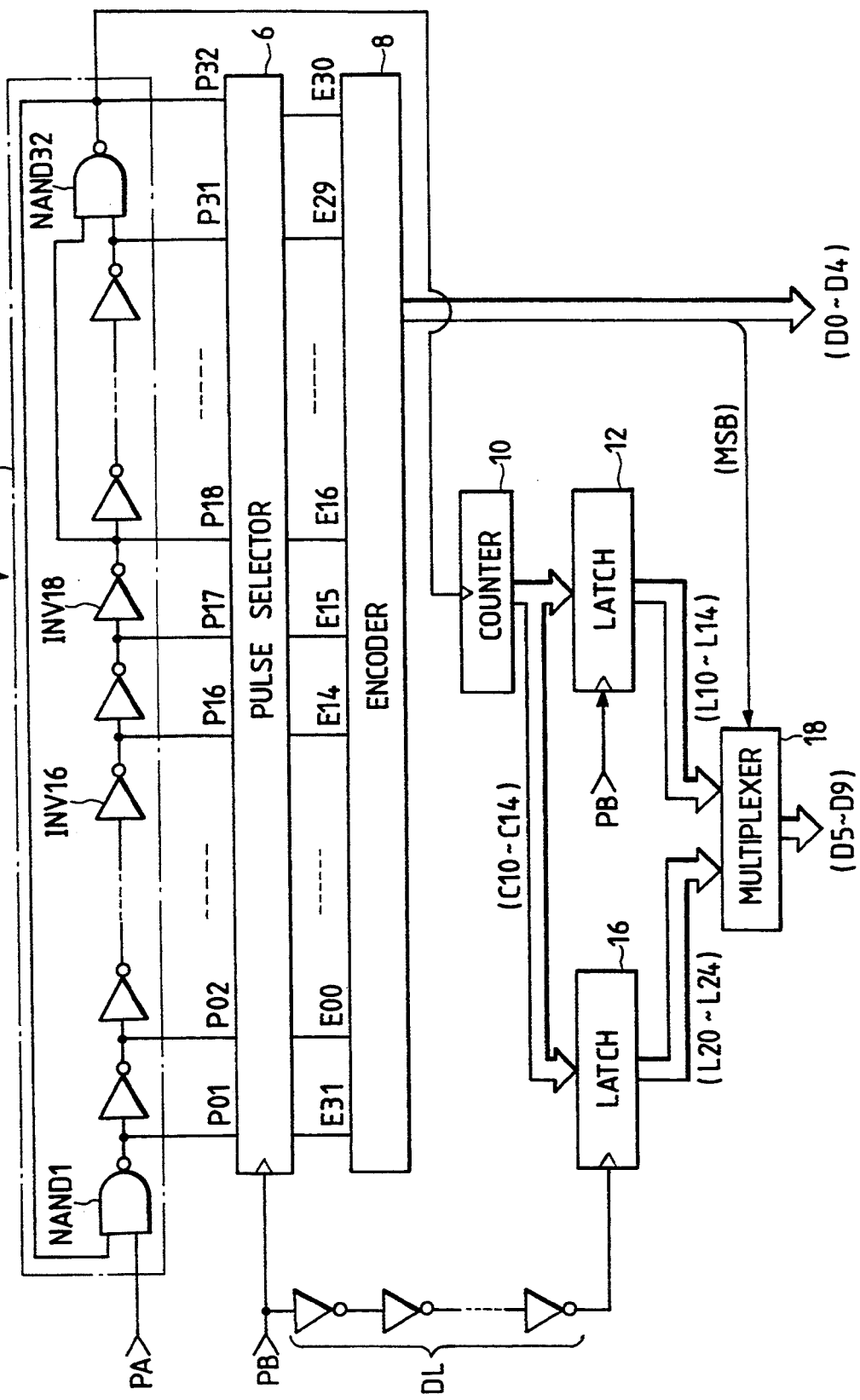
FIG. 6 is a block diagram of a pulse phase difference encoding circuit according to a ninth specific embodiment of this invention.

FIG. 6 shows a pulse phase difference encoding circuit 20 of a ninth specific embodiment of this invention which is similar to the pulse phase difference encoding circuit 4 of FIG. 3 except for design changes indicated hereinafter.

As shown in FIG. 6, the pulse phase difference encoding circuit 20 includes a delay circuit DL having a series combination of 16 inverters. The input terminal of the delay circuit DL is subjected to the latch pulse signal PB. The output terminal of the delay circuit DL is connected to the control terminal of the second latch circuit 16. The circuit DL delays the latch pulse signal PB by a time corresponding to a half of the signal flow loop in the ring oscillator 2. The output signal C10–C14 of the first counter 10 is applied to the input terminal of the second latch circuit 16. The second counter 14 (see FIG. 3) is omitted from the pulse phase difference encoding circuit 20.

The pulse phase difference encoding circuit 20 operates as follows. In the case where the main pulse edge exists in a position between the inverter INV17 at the 17-th stage and the NAND gate NAND32 at the 32-nd stage of the ring oscillator 2 when a rising edge occurs in the latch pulse signal PB, the output signal L10–L14 of the first latch circuit 12 is selected by the multiplexer 18. Thus, as in the pulse phase difference encoding circuit 4 of FIG. 3, the multiplexer 18 selects the output signal of the counter 10 receiving the output signal of the inverting circuit NAND32 which precedes the position of the main pulse edge by a length corresponding to at least a half of the signal flow loop in the ring oscillator 2, where the main pulse edge position occurs at the moment of the rising edge in the latch pulse signal PB.

In the case where the main pulse edge exists in a position between the NAND gate NAND1 at the 1-st stage and the inverter INV16 at the 16-th stage of the ring oscillator 2 when a rising edge occurs in the latch pulse signal PB, the output signal L20–L24 of the second latch circuit 16 is selected by the multiplexer 18. Thus, the multiplexer 18 enables the use of the output signal of the counter 10 which occurs after an interval corresponding to a half of the signal flow loop in the ring oscillator 2 since the moment of the occurrence of the rising edge in the latch pulse signal PB.

Accordingly, it is possible to always use the output signal of the counter 10 which has already been stable. Thus, the pulse phase difference encoding circuit 20 can accurately detect the phase difference between the start pulse signal PA and the latch pulse signal PB.

What is claimed is:

1. A ring oscillator for circulating pulse edges of two types therein, comprising:

an even number of inverting circuits connected in a ring, wherein each of the inverting circuits is operative to invert an input signal and output an inversion of the input signal;

wherein one of the inverting circuits comprises a first start inverting circuit which starts an operation of inverting an input signal in response to a first control signal applied from an external input;

wherein one of the inverting circuits except the first start inverting circuit and an inverting circuit immediately following the first start inverting circuit comprises a second start inverting circuit which starts an operation of inverting an input signal in response to a second control signal; and control signal inputting means for inputting the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit.

2. The ring oscillator of claim 1, wherein the control signal inputting means comprises means for inputting an output signal of a given inverting circuit, which precedes the second start inverting circuit as viewed from a side of the first start inverting circuit by stages corresponding to an even number of inverting circuits equal to or smaller than a half of the total number of all the inverting circuits, into the second start inverting circuit as the second control signal, and wherein the second start inverting circuit comprises means for, in cases where a signal level of the second control signal and a signal level of an input signal from an inverting circuit immediately-preceding the second start inverting circuit are equal, inverting said signal level and outputting an inversion of the signal level, and means for, in cases where the signal level of the second control signal and the signal level of the input signal from the inverting circuit immediately-preceding the second start inverting circuit are different, inverting one of the two signal levels and outputting an inversion of said one of the two signal levels with priority which is equal to a signal level of the second control signal inputted from the given inverting circuit when the first start inverting circuit does not start the inverting operation.

3. The ring oscillator of claim 1, wherein a response time is defined as being equal to an interval from a moment of an inversion of an input signal into each inverting circuit to a moment of an inversion of an output signal from said inverting circuit, and wherein a response time with respect to a first pulse edge initially generated by the start of the inverting operation of the first start inverting circuit and travelling while being sequentially inverted by the inverting circuits is longer than a response time with respect to a second pulse edge inverted to a level opposite a level of the first pulse edge.

4. A pulse phase difference encoding circuit comprising:

a ring oscillator for circulating pulse edges of two types therein which comprises an even number of inverting circuits connected in a ring, wherein each of the inverting circuits is operative to invert an input signal and output an inversion of the input signal; wherein one of the inverting circuits comprises a first start inverting circuit which starts an operation of inverting an input signal in response to a first control signal applied from an external input; wherein one of the inverting circuits except the first start inverting circuit and an inverting circuit following the first start inverting circuit comprises a second start inverting circuit which starts an operation of inverting an input signal in response to a second control signal; and control signal inputting means for inputting the second control signal to the second start inverting circuit during an interval from a first moment at which the first control signal is inputted into the first start inverting circuit and the first start inverting circuit starts the inverting operation to a second moment at which a pulse edge initially generated by the start of the inverting operation of the first start inverting circuit and travelling while being sequentially inverted by the inverting circuits enters the second start inverting circuit;

means for inputting a first input signal into the first start inverting circuit from an external input as the first control signal;

output terminals for outputting output signals of the inverting circuits in the ring oscillator respectively;

counting means receiving an output signal from a given output terminal of said output terminals for counting a number of times a pulse edge initially generated by the start of the inverting operation of the first start inverting circuit circulates in the ring oscillator during an interval from a moment of the start of the inverting operation of the first start inverting circuit in response to the first input signal to a moment at which a second input signal is inputted, and for outputting a digital signal representing said count number;

pulse edge detecting means receiving the output signals from the output terminals for detecting which of the inverting circuits the pulse edge initially generated by the start of the inverting operation of the first start inverting circuit reaches when the second input signal is inputted; and an encoder for outputting a number of inverting circuits from the first start inverting circuit to the inverting circuit detected by the pulse edge detecting means as a digital signal;

wherein a final digital signal is outputted as an indication of a phase difference between the first input signal and the second input signal, and the final digital signal has higher bits composed of the digital signal from the counting means and lower bits composed of the digital signal from the encoder.

5. A ring oscillator comprising:

an even number of inverting circuits connected in a first ring, wherein each of the inverting circuits is operative to invert an input signal and output an inversion of the input signal;

wherein one of the inverting circuits comprises a first start inverting circuit which starts an operation of inverting an input signal in response to a first control signal applied from an external input;

wherein one of the inverting circuits except the first start inverting circuit comprises a second start inverting circuit which starts an operation of inverting an input signal in response to a second control signal; and an odd number of inverting circuits including the second start inverting circuit and being connected in a second ring, wherein an output signal of one of the inverting circuits in the second ring is used as the second control signal.

6. The ring oscillator of claim 5, wherein the first start inverting circuit is in both the first ring and the second ring.

7. The ring oscillator of claim 5, wherein each of the first start inverting circuit and the second start inverting circuit comprises a NAND gate.

8. A ring oscillator comprising:

an even number of inverting circuits connected in a ring, wherein each of the inverting circuits is operative to invert an input signal and output an inversion of the input signal;

wherein a first one of the inverting circuits comprises a first start inverting circuit which starts an operation of inverting an input signal in response to a first control signal applied from an external input;

wherein a second one of the inverting circuits comprises a second start inverting circuit which starts an operation of inverting an input signal in response to an output signal of a third one of the inverting circuits which precedes the second start inverting circuit by an even number of inverting circuits.

9. The ring oscillator of claim 8, wherein each of the first start inverting circuit and the second start inverting circuit comprises a NAND gate.

10. An oscillator comprising:

a predetermined even number of inverting circuits connected in a loop and each being able to output an output signal having a predetermined inversion relation with an input ,signal thereto;

means for selectively breaking and enabling the predetermined inversion relation between the input signal and the output signal to and from a first one of the inverting circuits in response to an externally applied signal; and means for selectively breaking and enabling the predetermined inversion relation between the input signal and the output signal to and from a second one of the inverting circuits in response to the output signal of one of the inverting circuits except the second one in the loop.

* * * * *